(12) United States Patent
Kuroiwa

(10) Patent No.: US 9,917,583 B2
(45) Date of Patent: Mar. 13, 2018

(54) TERMINATION APPARATUS, TERMINATION CONTROL METHOD, AND STORAGE MEDIUM ON WHICH TERMINATION CONTROL PROGRAM HAS BEEN STORED

(71) Applicant: NEC Corporation, Tokyo (JP)

(72) Inventor: Tsuguhito Kuroiwa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 15/127,384

(22) PCT Filed: Feb. 26, 2015

(86) PCT No.: PCT/JP2015/000978
§ 371 (c)(1),
(2) Date: Sep. 19, 2016

(87) PCT Pub. No.: WO2015/141146
PCT Pub. Date: Sep. 24, 2015

(65) Prior Publication Data
US 2017/0134026 A1 May 11, 2017

(30) Foreign Application Priority Data

Mar. 20, 2014 (JP) ................................. 2014-057797

(51) Int. Cl.
*H03K 19/00* (2006.01)
(52) U.S. Cl.
CPC ................................ *H03K 19/0005* (2013.01)
(58) Field of Classification Search
None
See application file for complete search history.

(56) References Cited

U.S. PATENT DOCUMENTS 7,898,234 B1*  3/2011  Lash ..................... G05F 1/607
                                                          323/284
2003/0210022 A1* 11/2003  Takemura ........... H02M 3/1584
                                                          323/282
(Continued)

FOREIGN PATENT DOCUMENTS

CN      101132173 A     2/2008
CN      103493375 A     1/2014
(Continued)

OTHER PUBLICATIONS

International Search Report corresponding to PCT/JP2015/000978 dated May 12, 2015, 4 pages.
Taiwanese Office Action issued in corresponding Taiwan Patent Application No. 10620036380, dated Jan. 11, 2017. 12 pages.
Korean Office Action issued by the Korean Intellectual Property Office for Korean Application No. 10-2016-7029164 dated Aug. 28, 2017 (10 pages).

(Continued)

*Primary Examiner* — Crystal L Hammond
(74) *Attorney, Agent, or Firm* — Wilmer Cutler Pickering Hale and Dorr LLP

(57) ABSTRACT

[Problem] To provide a termination control apparatus that can provide an optimum termination state. [Solution] Included are: an input terminal to which an input signal is inputted; a termination resistance unit that terminates the input terminal by use of a variable resistor the resistance value of which can be set; a voltage measurement unit that measures the voltage of the input signal; and a control unit that changes the resistance value or a target voltage range when the voltage is not within the target voltage range having been set for the input signal on the basis of both an absolute maximum rated value and an operation-guaranteed voltage.

10 Claims, 13 Drawing Sheets

(56) References Cited

U.S. PATENT DOCUMENTS

| | | | |
|---|---|---|---|
| 2005/0052200 A1 | 3/2005 | Nguyen et al. | |
| 2005/0174143 A1 | 8/2005 | Nguyen et al. | |
| 2007/0085562 A1 | 4/2007 | Nguyen et al. | |
| 2007/0290714 A1 | 12/2007 | Nguyen et al. | |
| 2009/0278565 A1 | 11/2009 | Nguyen et al. | |
| 2010/0259295 A1 | 10/2010 | Nguyen et al. | |
| 2011/0068855 A1* | 3/2011 | Ikenaga | G06F 1/3203 327/535 |
| 2011/0133773 A1* | 6/2011 | Shau | H03K 19/0005 326/30 |
| 2011/0193591 A1 | 8/2011 | Nguyen et al. | |
| 2013/0021056 A1 | 1/2013 | Nguyen et al. | |
| 2013/0328992 A1* | 12/2013 | Hayakawa | G03G 15/80 347/224 |
| 2014/0043084 A1* | 2/2014 | Iwata | H03K 19/018521 327/306 |
| 2014/0347141 A1* | 11/2014 | Shibayama | H03H 7/38 333/17.3 |
| 2015/0256186 A1* | 9/2015 | Matsubara | H03L 7/08 327/158 |

FOREIGN PATENT DOCUMENTS

| | | |
|---|---|---|
| JP | H06-125261 A | 5/1994 |
| JP | 2002-007360 A | 1/2002 |
| JP | 2006520113 A | 8/2006 |
| JP | 2010-268350 A | 11/2010 |
| JP | 2011-081733 A | 4/2011 |
| KR | 10-2007-0008245 A | 1/2007 |
| TW | 201406075 A | 2/2014 |
| WO | WO-2011/128956 A1 | 10/2011 |
| WO | WO-2012 157031 A1 | 11/2012 |

OTHER PUBLICATIONS

Taiwanese Office Action issued by the Taiwan Patent Office for Taiwanese Application No. 104108392 dated May 22, 2017 (19 pages).

Japanese Office Action issued by the Japan Patent Office for Japanese Application No. 2016-508491 dated Dec. 5, 2017 (4 pages).

* cited by examiner

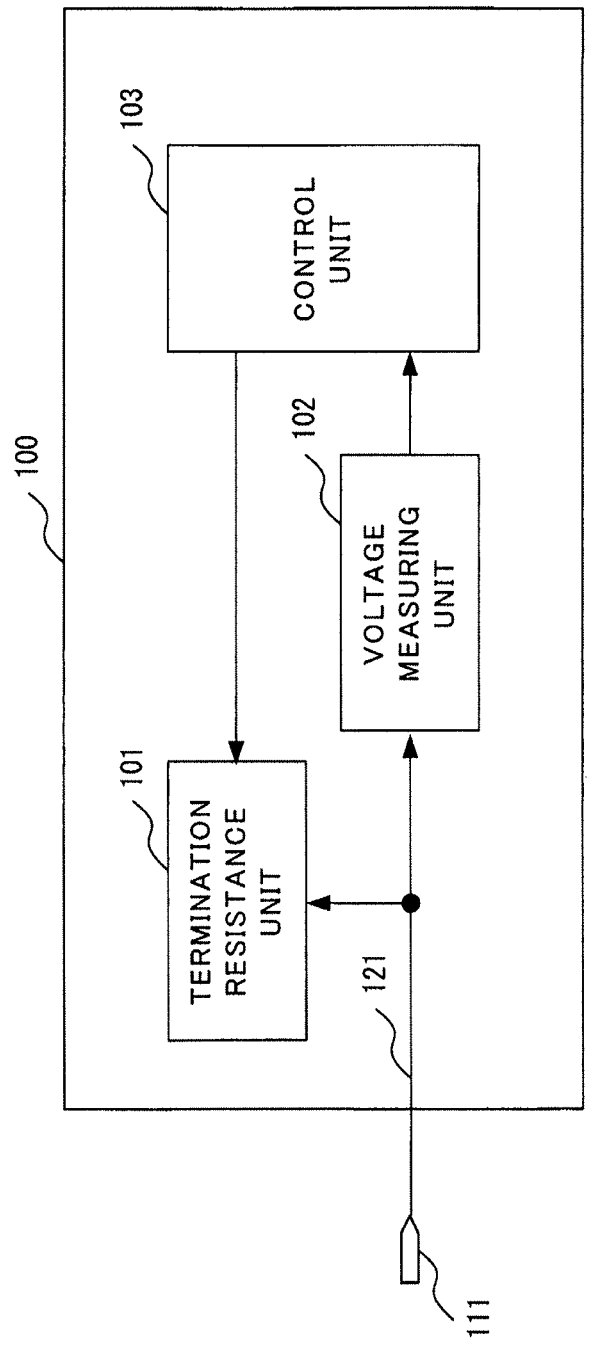

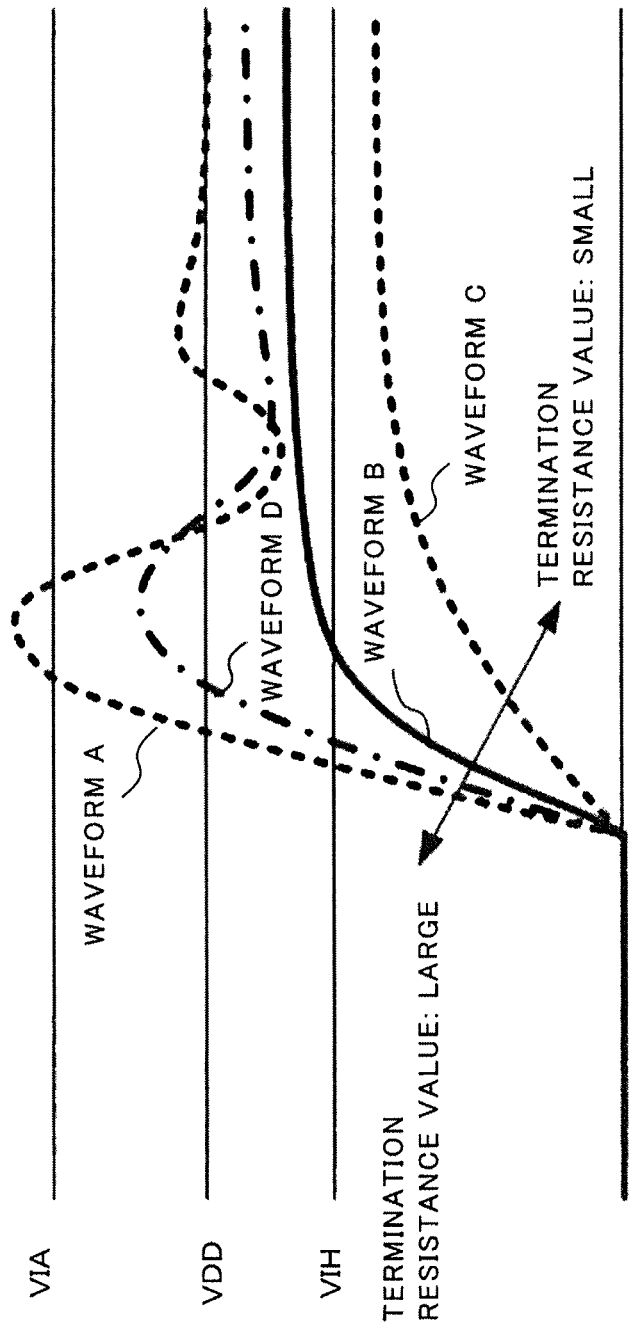

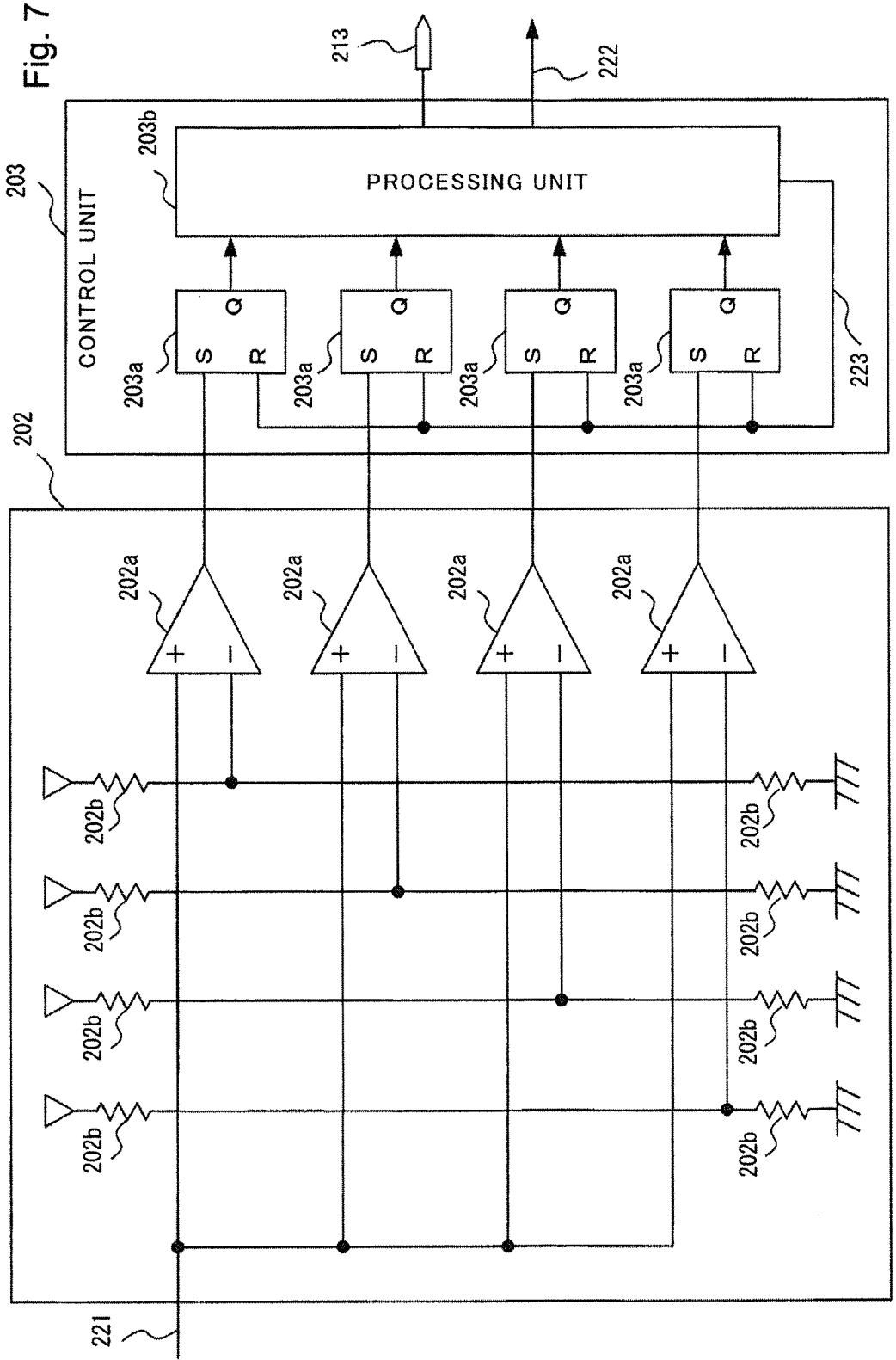

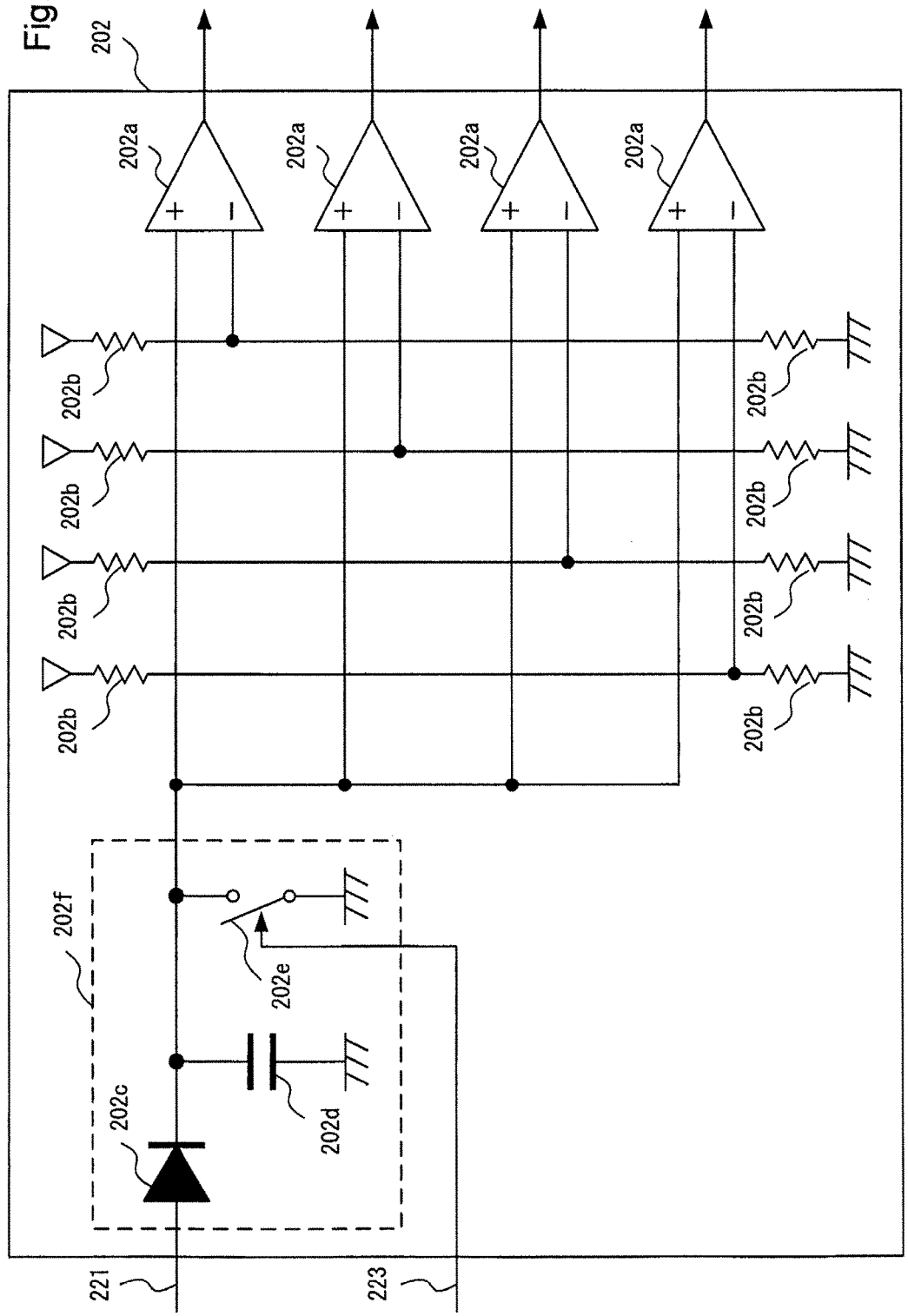

TERMINATION APPARATUS, TERMINATION CONTROL METHOD, AND STORAGE MEDIUM ON WHICH TERMINATION CONTROL PROGRAM HAS BEEN STORED

CROSS-REFERENCE TO RELATED APPLICATIONS

This application is a national stage application of International Application No. PCT/JP2015/000978 entitled "Termination Apparatus, Termination Control Method, And Storage Medium On Which Termination Control Program Has Been Stored" filed on Feb. 26, 2015, which claims priority to Japanese Application No. 2014-057797 filed on Mar. 20, 2014, the disclosures of which are hereby incorporated by reference in their entirety.

TECHNICAL FIELD

The present invention relates to a termination apparatus, a termination control method, and a storage medium storing a termination control program capable of controlling a termination state, and more particularly, to a termination control apparatus, a termination control method, and a storage medium storing a termination control program capable of setting an optimum termination state.

BACKGROUND ART

Various criteria such as an "absolute maximum rating", a "Direct Current (DC) standard", or an "Alternate Current (AC) standard" to be satisfied are defined for an input signal to an electronic device such as a semiconductor device in terms of standards. The "absolute maximum rating" for an input signal is a voltage value that should not exceed even instantaneously, because the device may be destroyed at the voltage value. The "DC standard" for an input signal is a range of an input voltage within which the device can perform an intended normal operation. The "AC standard" for an input signal is a time standard such as an input timing of a signal, which should be satisfied for causing the device to perform an intended normal operation.

When a signal that violates the absolute maximum rating or the DC standard is input and output between electronic devices, the signal may cause a failure or an erroneous operation of an electronic device on the input side. In view of the above, a measure in which an appropriate termination resistance is disposed is required to be taken so that an input signal satisfies the absolute maximum rating or the DC standard. The value of the termination resistance in this case (hereinafter, referred to as a "termination resistance value") is required to be an appropriate value, which is set so that an input signal satisfies the absolute maximum rating or the DC standard.

Meanwhile, a termination resistance may be incorporated in an electronic device in order to reduce a mounting area or the cost. For instance, a Double Data Rate 2-Synchronous Dynamic Random Access Memory (DDR2-SDRAM) is capable of shaping the waveform of an input signal with use of a built-in termination resistance, as an On Die Termination (ODT) function. Note that it is necessary for the user to set the termination resistance value to an appropriate value in advance.

As a method for obtaining an appropriate termination resistance value, there is a method by theoretical calculation such as simulation. In the method, it is necessary to consider various parameters such as drawing a wiring pattern, which may affect wiring electrical characteristics. However, it is not easy to obtain accurate values of parameters. Therefore, it is often the case that a large workload or a large amount of money is necessary for calculating an appropriate termination resistance value as a result.

Also, a method in which changing a termination resistance value and evaluating an actual device are repeated may be used in order to obtain an appropriate termination resistance value. In this method, it is necessary to evaluate an actual device each time a termination resistance value is changed. Therefore, an appropriate termination resistance value may not be obtained within a short period of time, and it is often the case that a large workload is required.

Various techniques for changing the termination resistance value of an input terminal are known. A multiprocessor device described in PTL 1 changes the termination resistance value according to the number of devices connected to a bus on the signal output side.

A memory control device described in PTL 2 detects occurrence of an undershoot or an overshoot. Further, the memory control device described in PTL 2 changes the termination resistance value when an undershoot or an overshoot occurs, and controls the driving performance of a device on the transmission side when it is difficult to eliminate an undershoot or an overshoot only by using the termination resistance value.

CITATION LIST

Patent Literature

[PTL 1] Japanese Laid-open Patent Publication No. 2002-7360 (pages 3 to 4, and FIG. 1)
[PTL 2] Japanese Laid-open Patent Publication No. 2011-81733 (pages 5 to 6, and FIG. 3)

SUMMARY OF INVENTION

Technical Problem

The multiprocessor device described in PTL 1 changes the value of a termination resistance incorporated in a device depending on the number of devices connected to a bus on the output side, without observing an actual input waveform. Normally, output characteristics of an output-side device may not only differ among devices depending on the types of devices, production tolerance, or the like, but also have temperature dependence and differ among terminals. Therefore, even when a termination resistance value is set depending on the number of devices connected to a bus, an optimum input signal waveform may not always be obtained. In other words, even when a measure on the basis of the technique described in PTL 1 is taken, an input signal may not always have an appropriate waveform that satisfies the standard.

The memory control device described in PTL 2 detects occurrence of an undershoot or an overshoot by comparing an undershoot voltage or an overshoot voltage with a predetermined threshold value. Further, the memory control device controls the termination resistance or the driving performance of an output-side device on the basis of a comparison result, and determines that the measure is completed when occurrence of an undershoot or an overshoot is not detected.

However, the requirement that a signal to be input and output to and from a device satisfies a predetermined condition at the time of testing is not absolute. As described above, output characteristics of a device are not uniform and have temperature dependence among individual devices or terminals. Further, a termination resistance value also has an error and temperature dependence. Therefore, an undershoot or an overshoot may occur during an operation of a device to be actually used, even when an undershoot or an overshoot does not occur at the time of testing a device to be tested. In view of the above, it is desirable to judge whether an undershoot or an overshoot occurs at the time of testing not on the basis of stereotypical criteria but on the basis of flexibly set criteria.

OBJECT OF INVENTION

In view of the aforementioned technical problems, an object of the present invention is to provide a termination control apparatus, a termination control method, and a storage medium storing a termination control program that can realize to set an appropriate termination state.

Solution to Problem

A termination device, according to the present invention, comprises:
an input terminal which receives an input signal;
a termination resistance unit which terminates the input terminal by a variable resistance whose resistance value is settable;
a voltage measuring unit which measures a voltage of the input signal; and
a control unit which changes the resistance value or a target voltage range when the voltage is not included in the target voltage range set for the input signal on the basis of an absolute maximum rating value and an operation guarantee voltage.

A termination control method, according to the present invention, comprises:
measuring a voltage of an input signal input to an input terminal; and
changing a resistance value which terminates the input terminal or a target voltage range when the voltage is not included in the target voltage range set for the input signal on the basis of an absolute maximum rating value and an operation guarantee voltage.

A storage medium storing a termination control program, according to the present invention, which causes a computer provided in a termination device including an input terminal which receives an input signal, a termination resistance unit which terminates the input terminal by a variable resistance whose resistance value is settable, and a voltage measuring unit which measures a voltage of the input signal to function as:
a control unit which changes the resistance value or a target voltage range when the voltage is not included in the target voltage range set for the input signal on the basis of an absolute maximum rating value and an operation guarantee voltage.

Advantageous Effects of Invention

The termination control apparatus, the termination control method, and the storage medium storing a termination control program of the present invention can advantageously realize an optimum termination state.

BRIEF DESCRIPTION OF DRAWINGS

FIG. 1 is a block diagram illustrating a configuration example of a termination device in a first exemplary embodiment of the present invention.

FIG. 3 is a graph illustrating changes in the rising waveform of an input signal when a termination resistance value is changed in the first exemplary embodiment of the present invention.

FIG. 7 is a block diagram illustrating an example of an internal configuration of a voltage measuring unit and a control unit in the second exemplary embodiment of the present invention.

FIG. 8 is a block diagram illustrating another example of the internal configuration of the voltage measuring unit in the second exemplary embodiment of the present invention.

DESCRIPTION OF EMBODIMENTS

First Exemplary Embodiment

Figure 2A:
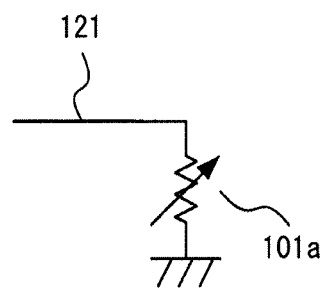
FIG. 2A illustrates a connection example of a variable resistor to be included in a termination resistance unit in the first exemplary embodiment of the present invention.

Next, exemplary embodiments of the present invention are described in detail referring to the drawings. FIG. 1 is a block diagram illustrating a configuration example of a termination device in the first exemplary embodiment of the present invention.

A termination device 100 in the exemplary embodiment includes a termination resistance unit 101, a voltage measuring unit 102, and a control unit 103.

The termination resistance unit 101 includes a variable resistor (not illustrated) connected to an input terminal 111, and terminates the input terminal 111. A resistance value of the variable resistor, in other words, a termination resistance value is set by the control unit 103.

Figure 2B:
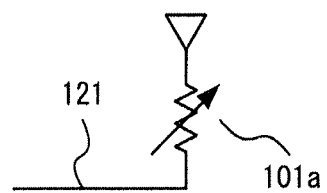
FIG. 2B illustrates a connection example of the variable resistor to be included in the termination resistance unit in the first exemplary embodiment of the present invention.
Figure 2C:
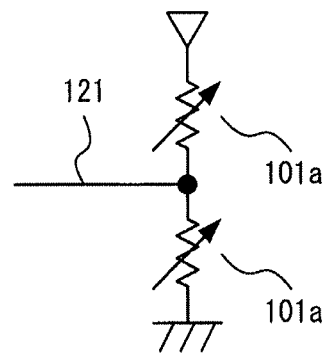
FIG. 2C illustrates a connection example of the variable resistor to be included in the termination resistance unit in the first exemplary embodiment of the present invention.

FIG. 2A to FIG. 2C illustrate specific connection examples of a variable resistor 101a to be included in the termination resistance unit 101. As illustrated in FIG. 2A to FIG. 2C, the variable resistor 101a has a circuit configuration such as a pulldown configuration (FIG. 2A), a pullup configuration (FIG. 2B), or a Thevenin configuration (FIG. 2C); and terminates an input signal 121 input to the input terminal 111. Note that, in a pullup configuration and a Thevenin configuration, a potential of the variable resistor on the high potential side is set as necessary, taking into consideration a "target voltage range" to be described later. Normally, a potential of the variable resistor on the high potential side is set to a power source voltage of a device to be connected to the input terminal 111.

Note that the circuit configuration of the variable resistor 101a in the termination resistance unit 101 is not limited. An appropriate circuit configuration may be selected so that an optimum termination state is obtained, in other words, the input signal 121 satisfies the standard with a larger margin.

The voltage measuring unit 102 measures a voltage of the input signal 121 (hereinafter, referred to as an "input voltage"), and notifies a measurement result to the control unit 103. The voltage detection unit 102 continuously measures a voltage in order to handle a transitional change in the input voltage.

The control unit 103 holds a measurement result that is continuously input from the voltage measuring unit 102. Further, the control unit 103 holds a "target voltage range" indicating a voltage range to be satisfied by an input voltage. The control unit 103 can change the target voltage range.

The control unit 103 obtains an amplitude of an overshoot and an amplitude of an undershoot, which occur in the input signal 121, with use of a held measurement result. The highest voltage corresponding to the amplitude of an overshoot can be obtained as a maximum value of an input voltage, and the lowest voltage corresponding to the amplitude of an undershoot can be obtained from a minimum value of an input voltage. Then, the control unit 103 changes the termination resistance value of the termination resistance unit 102 on the basis of a comparison result between a detected highest voltage corresponding to the amplitude of an undershoot or a detected lowest voltage corresponding to the amplitude of an undershoot, and the target voltage range.

FIG. 3 is a graph illustrating changes in the rising waveform of the input signal 121 when the termination resistance value is changed. The horizontal axis of the graph indicates a time, and the vertical axis of the graph indicates a voltage. FIG. 3 exemplifies a case, in which a termination resistance value is adjusted for a measure against an overshoot.

In the example illustrated in FIG. 3, when the termination resistance value is large, an overshoot of a level exceeding a maximum value VIA [V] of the absolute maximum rating with respect to the input signal 121 occurs in the input signal 121 (waveform A).

In view of the above, the control unit 103 reduces the termination resistance value so that a waveform (waveform B) in which an overshoot does not occur in, the input signal 121, and the input signal 121 rises up to a level exceeding a high level input voltage VIH [V] is obtained.

Note that when the termination resistance value is excessively reduced, an overshoot does not occur in the input signal 121, but the input signal 121 does not rise up to a level exceeding the high level input voltage VIH (waveform C). In this case, the control unit 103 increases the termination resistance value.

As described above, the control unit 103 controls the termination resistance value in such a manner that the instantaneous maximum voltage of the input signal 121 is not larger than the maximum value VIA of the absolute maximum rating, and that the voltage of the input signal 121 in an stable state is not smaller than the high level input voltage VIH. In other words, the control unit 103 controls the termination resistance value in such a manner that the waveform of the input signal 121 is set to a state as expressed by the waveform B illustrated in FIG. 3. The termination resistance value obtained as described above is an optimum termination resistance value.

Note that when the termination resistance value is reduced in such a manner that an overshoot does not occur in the input signal 121, the level of the input signal 121 in a stable state may be lowered, and the input signal 121 may not rise up to the high level input voltage VIH, as expressed by the waveform C. In this case, the termination resistance value may be set in such a manner that although an overshoot occurs in the input signal 121, the input signal 121 stays equal to or below the maximum value VIA of the absolute maximum rating, and rises up to the high level input voltage VIH, as expressed by the waveform D. Alternatively, in this case, the control unit 103 may output an alarm indicating that adjustment of the termination resistance value has failed.

Figure 4:
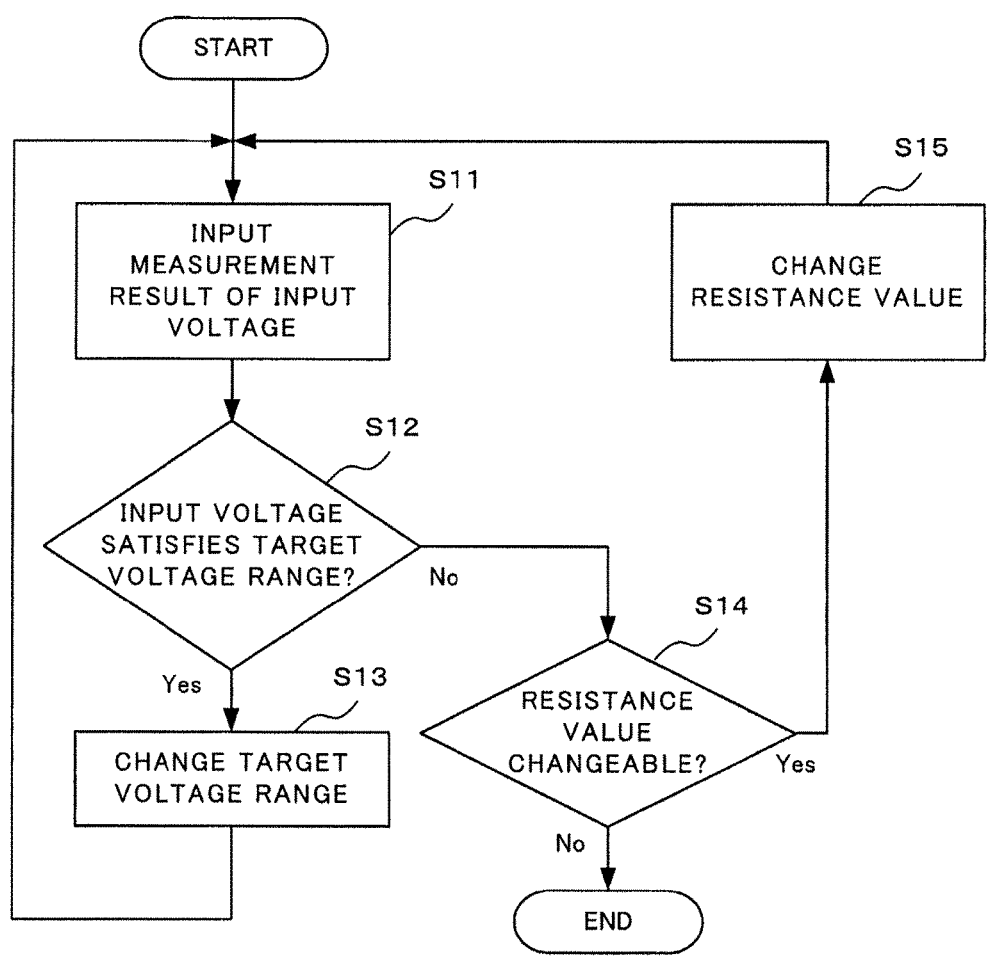
FIG. 4 is a flowchart illustrating an example of a control operation of a termination resistance value by a control unit in the first exemplary embodiment of the present invention.

Next, a control operation of the termination resistance value by the control unit 103 is described. FIG. 4 is a flowchart illustrating an example of a control operation of the termination resistance value by the control unit 103. It is assumed that an initial value of a target voltage range to be satisfied by an input voltage is set in advance by a user in the control unit 103.

First of all, the control unit 103 receives a measurement result of an input voltage from the voltage measuring unit 102 (Step S11).

Next, the control unit 103 judges whether or not the measurement result satisfies the target voltage range, in other words, whether or not the measurement result is included in the target voltage range (Step S12).

When the measurement result satisfies the target voltage range (Yes in S12), the control unit 103 changes the target voltage range (Step S13). In this example, it is desirable to change the target voltage range in such a manner that a margin increases with respect to the absolute maximum rating and the DC standard because the input voltage satisfies the target voltage range.

When the target voltage range is changed, the control unit 103 returns to the process of receiving a measurement result of an input voltage (S11).

When the measurement result does not satisfy the target voltage range (No in S12), the control unit 103 judges whether or not it is possible to change the termination resistance value (Step S14). This is because although the termination resistance value is changeable, the changeable range is inevitably limited.

When it is possible to change the termination resistance value (Yes in S14), the control unit 103 changes the termination resistance value (Step S15), and returns to the process of receiving a measurement result of an input voltage (S11).

When it is impossible to change the termination resistance value (No in S14), the control unit 103 terminates the process. This is because incapability of changing the termination resistance value means that it is impossible to set the termination resistance value in such a manner that an input voltage satisfies the target voltage range.

Note that although it is impossible to set the termination resistance value in such a manner that an input voltage satisfies a target voltage range at the point of time, it may be possible to set the termination resistance value in a different target voltage range. In view of the above, when it is impossible to change the termination resistance value (No in S14), the control unit 103 may return to the process of changing the target voltage range (S13). In this case, it is necessary to change the target voltage range in such a manner as to reduce the margin with respect to the absolute maximum rating and the DC standard, in other words, in such a manner that the target voltage range is approached to the absolute maximum rating and the DC standard, because the input voltage does not satisfy the target voltage range.

As described above, the termination device 100 in the exemplary embodiment changes the target voltage range, and further repeats adjustment of the termination resistance value even when an input voltage satisfies the target voltage range. Therefore, the margin of the target voltage range with respect to the absolute maximum rating and the DC standard can be changed as necessary according to an actual waveform of the input signal 121. This makes it possible to set a more appropriate termination state.

Note that, as illustrated in FIG. 2, the variable resistor 101a in the termination resistance unit 101 may have various circuit configurations. In view of the above, when it is impossible to change the termination resistance value (No in S14), the control unit 103 may change the circuit configuration of the termination resistance unit 101, and may return to the process of receiving a measurement result of an input voltage (S11). This is because even when it is impossible to set a termination resistance value in such a manner that an input voltage satisfies a target voltage range when the termination resistance unit 101 has a certain circuit configuration, it may be possible to set a termination resistance value when the termination resistance unit 101 has another circuit configuration.

Further, the circuit configuration may be changed even when it is possible to change the termination resistance value (Yes in S14). This is because it is possible to set the target voltage range narrower by changing a circuit configuration.

Figure 5:
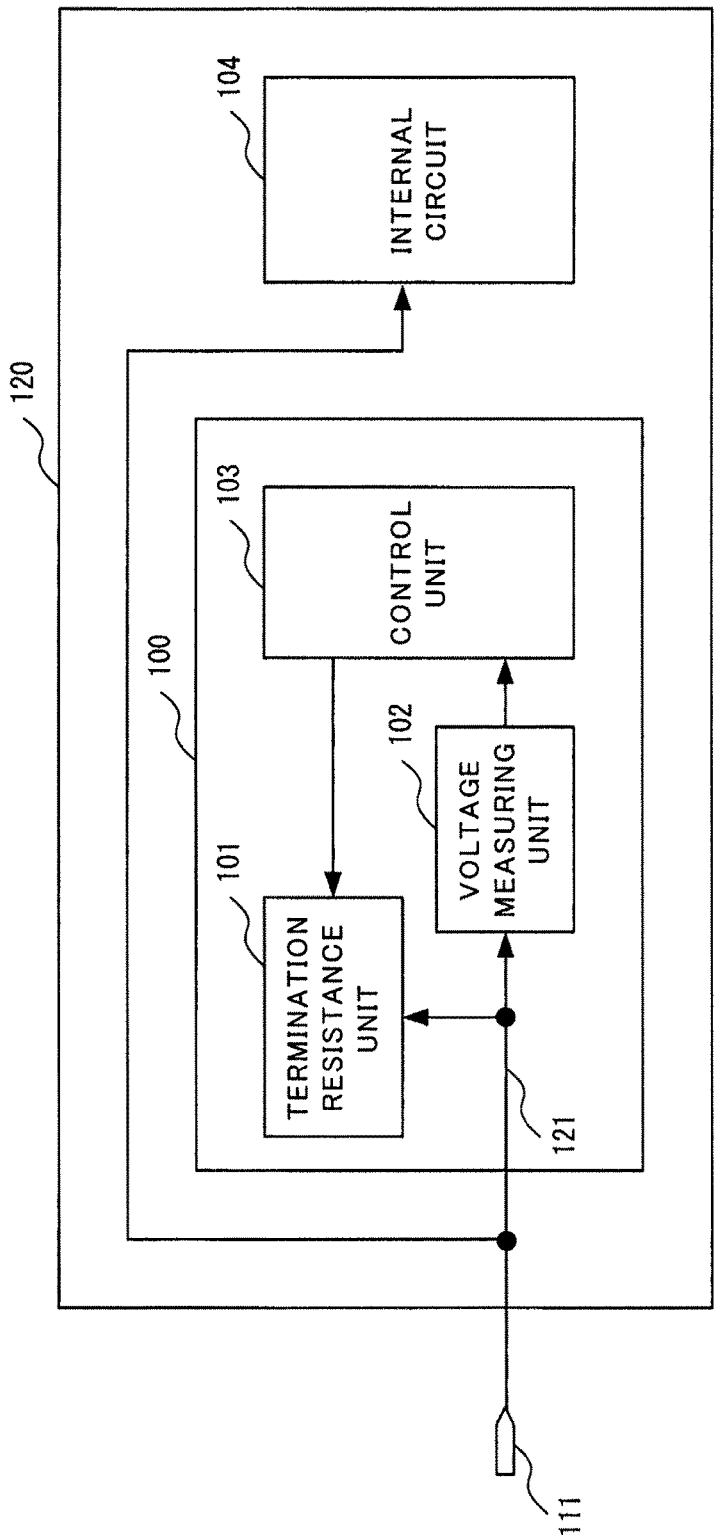
FIG. 5 is a block diagram illustrating a configuration example of an electronic device incorporated with the termination device in the first exemplary embodiment of the present invention.

Note that the termination device 100 may be incorporated in an electronic device 120 such as a semiconductor device. FIG. 5 is a block diagram illustrating a configuration example of an electronic device incorporated with the termination device 100 in the exemplary embodiment. In the electronic device 120, the input signal 121 is input not only to the termination device 100 but also to an internal circuit 104.

Second Exemplary Embodiment

As described above, the termination device of the present invention may be incorporated in a semiconductor device such as a Large Scale Integrated Circuit (LSI). The semiconductor device may be incorporated with switches such as Field Effect Transistors (FETs), resistances, a voltage measuring circuit, and a control circuit for performing a predetermined process. Then, the semiconductor device is capable of performing a control, in which the control circuit controls ON/OFF of the switches, and controls a termination resistance value by changing connection or combination of the built-in resistances on the basis of a measurement result of an input voltage from the voltage measuring circuit.

Figure 6:
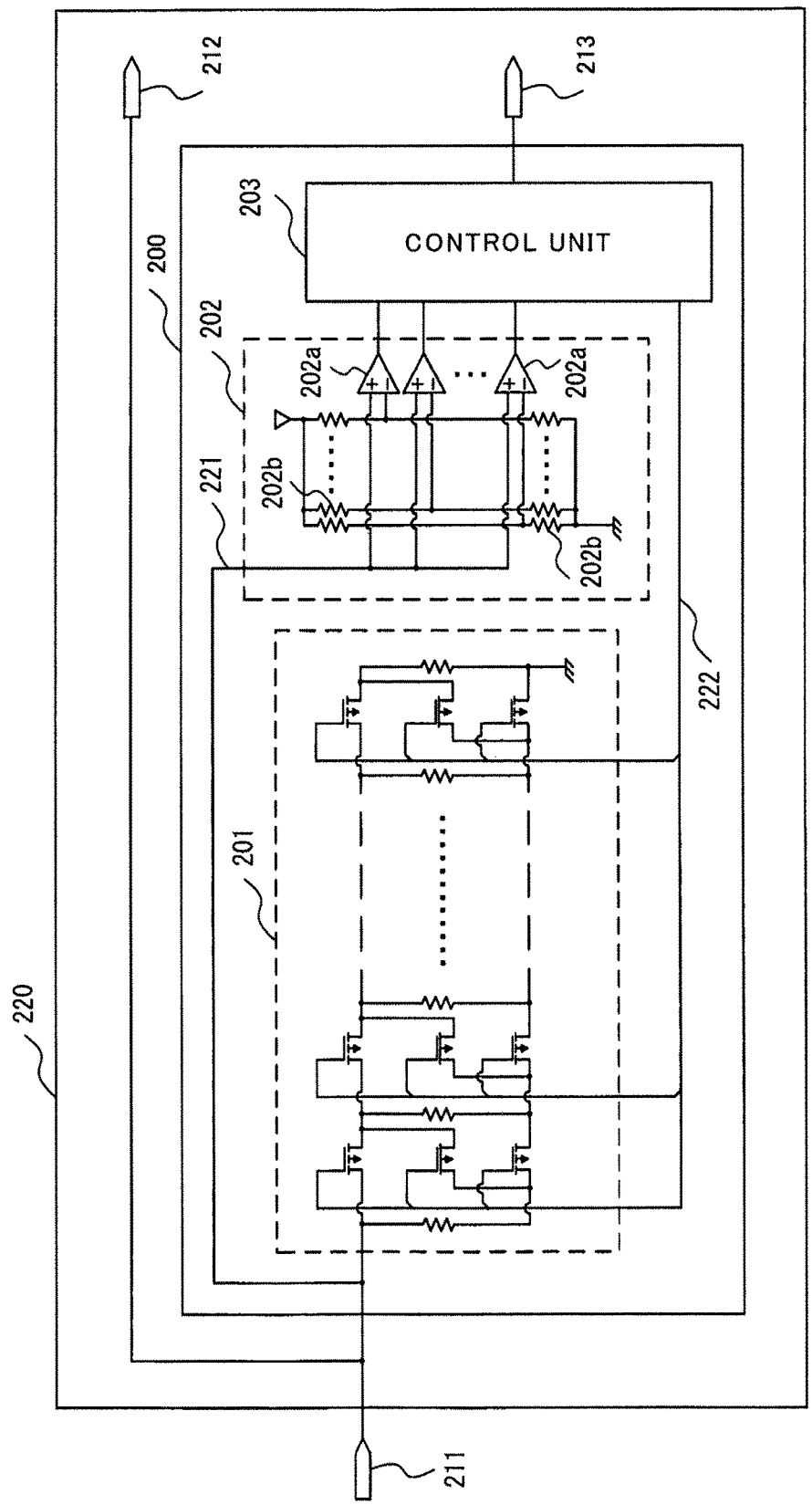
FIG. 6 is a block diagram illustrating a configuration example of a semiconductor device in a second exemplary embodiment of the present invention.

As the second exemplary embodiment of the present invention, a semiconductor device incorporated with a termination device is described in detail referring to the drawings. FIG. 6 is a block diagram illustrating a configuration example of a semiconductor device 220 in the exemplary embodiment.

The semiconductor device 220 is incorporated with a termination unit 200. An input terminal 211 is connected to an internal terminal 212. Then, an input signal 221 input to the input terminal 211 serves as an input signal in an internal circuit of the semiconductor device 220.

The termination unit 200 is provided with a termination resistance unit 201, a voltage measuring unit 202, and a control unit 203.

The termination resistance unit 201 includes a variable resistor connected to the input terminal 211, and terminates the input terminal 211. A resistance value of the variable resistor, specifically, a termination resistance value is set by a resistance value control signal 222 from the control unit 203. The structure of the variable resistance unit to be included in the termination resistance unit 201, and a method for controlling a termination resistance value will be described later.

The voltage measuring unit 202 measures a voltage of the input signal 221 (hereinafter, referred to as an "input voltage"), and notifies a measurement result to the control unit 203. The voltage detecting unit 202 includes a plurality of comparators 202a.

The input signal 221 is input to all non-inverting input terminals of the plurality of the comparators 202a.

Reference voltages different from each other are input to all inverting input terminals of the plurality of the comparators 202a. Therefore, it is possible to know the range of an input voltage by referring to outputs of the plurality of the comparators 202a. Note that it is possible to generate a reference voltage by an arbitrary method. In the exemplary embodiment, a reference voltage is generated by dividing a power source voltage by divided resistances 202b.

The control unit 203 holds a predetermined target voltage range, and determines whether or not a measurement result notified from the voltage measuring unit 202 is included in the target voltage range. Then, the control unit 203 changes the termination resistance value of the termination resistance unit 201 on the basis of a determination result. Specifically, the control unit 203 changes the termination resistance value of the termination resistance unit 201 so that the input voltage is included in the target voltage range.

After the input voltage is included in the target voltage range, the control unit 203 continues setting of a target voltage range and the aforementioned adjustment. Specifically, the control unit 203 changes the target voltage range to a narrower range for adjustment to a more appropriate termination resistance value.

The control unit 203 outputs an alarm signal to an alarm terminal 213 when a measurement result is not included in the target voltage range even after the termination resistance value is changed in a changeable range.

Meanwhile, the control unit 203 is required to detect a maximum voltage of a pulse of an extremely narrow width, which is transitionally generated, such as an overshoot or an undershoot. In view of the above, the control unit 203 is provided with a holding unit for holding a measurement result notified from the voltage measuring unit 202. Further, the control unit 203 is provided with a processing unit which performs a predetermined judgment for controlling the termination resistance value of the termination resistance unit 201.

FIG. 7 is a block diagram illustrating an example of an internal configuration of the voltage measuring unit 202 and the control unit 203. As described above, the control unit 203 includes Reset Set (RS) latches 203a as a holding unit. An RS latch may also be called an "RS flip-flop".

The RS latch 203a is set when the output of the comparator 202a in the voltage measuring unit 202 is set to a high level. As described above, reference voltages for use in comparison between the plurality of the comparators 202a differ from each other. Therefore, appropriately setting each of the reference voltages of the plurality of the comparators 202a makes it possible to detect a maximum value of overshoot which occurs in the input signal 221 from outputs of a plurality of the RS latches 203a. Further, when an overshoot does not occur, the maximum value of the input signal 221 can be regarded as a high level input voltage in a stable state.

The processing unit 203b in the control unit 203 detects a maximum value of overshoot and a high level input voltage in a stable state on the basis of outputs of the plurality of the RS latches 203a. Then, the processing unit 203b controls the termination resistance value of the termination resistance unit 201 with use of the resistance value control signal 222 on the basis of a comparison result between a detection result and a target voltage range.

Note that the RS latch 203a is reset in response to an input of a reset signal 223. The reset signal 223 is input to each of the RS latches 203a in order to clear the measurement result, each time the processing unit 203b terminates a judgement with respect to an input voltage, which will be described later.

Meanwhile, the time duration of an overshoot is very short, and the RS latches 203a may fail to respond. This may make it difficult to set the RS latches 203a. In such a case, the pulse width may be increased by an appropriate method. A method for increasing the pulse width is described in Published Japanese Translation of PCT International Application Publication No. 2006-520113, for instance.

The control unit 203 illustrated in FIG. 7 detects a maximum value of overshoot, which occurs in the input signal 221 by the RS latches 203a. A peak-hold circuit may be used in order to detect a maximum value of overshoot. FIG. 8 is a block diagram illustrating an example of an internal configuration of the voltage measuring unit 202. As illustrated in FIG. 8, the voltage measuring unit 202 may be provided with a peak-hold circuit 202f. The peak-hold circuit 202f includes a diode 202c, a capacitor 202d, and a discharging switch 202e. Electric charge held by the capacitor 202d is reset when the discharging switch 202e is set to an ON-state in response to an input of the reset signal 223.

The peak-hold circuit 202f holds a maximum value of voltage of the input signal 221. Therefore, a maximum value of an input voltage is directly expressed by outputs of the plurality of the RS latches 203a. Thus, the control unit 203 does not have to hold outputs of the comparators 202a.

Note that two input terminals of each of the comparators 202a in the voltage measuring unit 202 illustrated in FIG. 6, FIG. 7, and FIG. 8 are connected in such a manner that a maximum voltage of overshoot that occurs in the input signal 221, and a high level input voltage are detected. In order to detect a minimum voltage of undershoot that occurs in the input signal 221 and a low level input voltage, connection of two input terminals of each of the comparators 202a may be reversed with respect to the example illustrated in FIG. 6, FIG. 7, and FIG. 8 so that a negative voltage is input as a reference voltage. Modification to be added to the configuration of FIG. 6, FIG. 7, and FIG. 8 in order to detect a minimum voltage of the undershoot and a low level input voltage is obvious to a person skilled in the art. Therefore, detailed description about the modification is omitted herein.

The details of an internal configuration of the termination resistance unit 201 are described. FIG. 9 is circuit diagrams illustrating an example of an internal configuration of the termination resistance unit 201. The termination resistance unit 201 in the exemplary embodiment has a pulldown circuit configuration. Note that the configuration of a variable resistor to be included in the termination resistance unit 201 is arbitrary, and is not limited to the ones illustrated in FIG. 9.

The termination resistance unit 201 is provided with parallel connection switches 201a, serial connection switches 201b, and fixed resistances 201c. The parallel connection switches 201a and the serial connection switches 201b are, for instance, switches constituted by transistors such as FETs.

There are a total of n (where n is a natural number) pairs of parallel connection switches 201a in a state that each two parallel connection switches 201a constitute a pair. When a pair of parallel connection switches 201a are set to an ON-state, the number of fixed resistances 201c to be connected in parallel within the termination resistance unit 201 increases by one. Conversely, when a pair of parallel connection switches 201a are set to an OFF-state, the number of fixed resistances 201c to be connected in parallel decreases by one.

There are n serial connection switches 201b. When one serial connection switch 201b is set to an ON-state, the number of fixed resistances 201c to be connected in series within the termination resistance unit 201 increases by one. Conversely, when one serial connection switch 201b is set to an OFF-state, the number of fixed resistances 201c to be connected in series decreases by one.

There are (n+1) fixed resistances 201c.

Figure 9A:
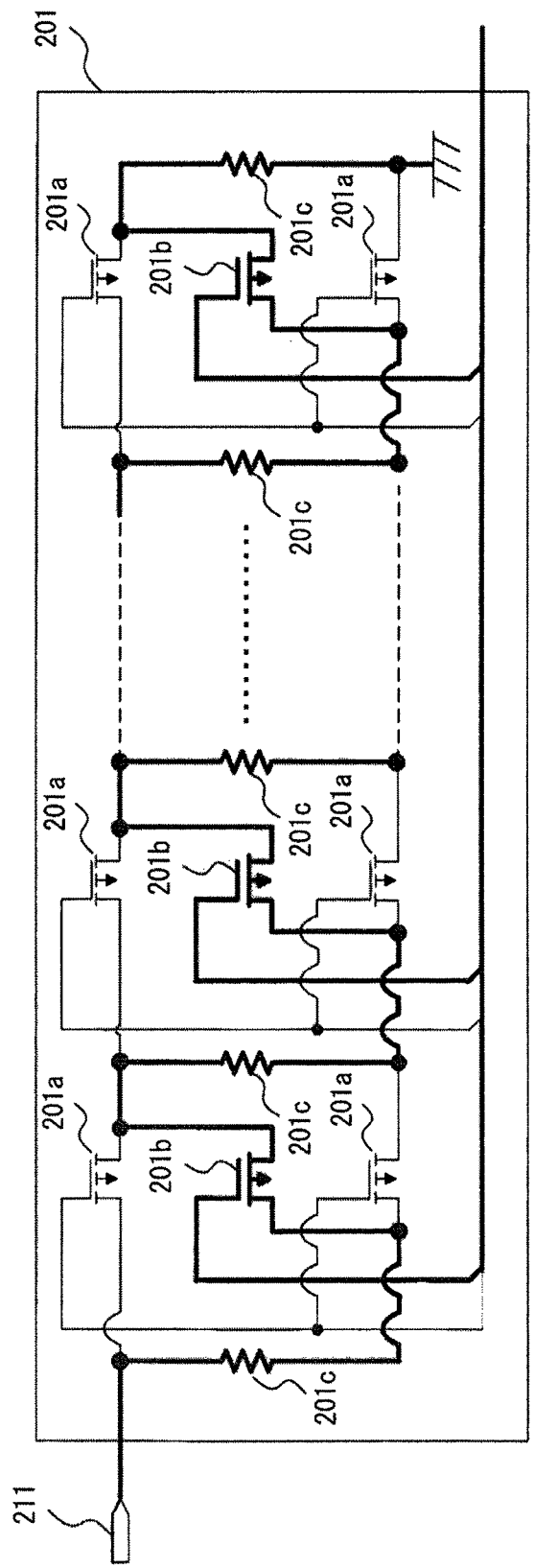
FIG. 9A is a circuit diagram illustrating an example of an internal configuration of an end point resistance unit in the second exemplary embodiment of the present invention.
Figure 9B:
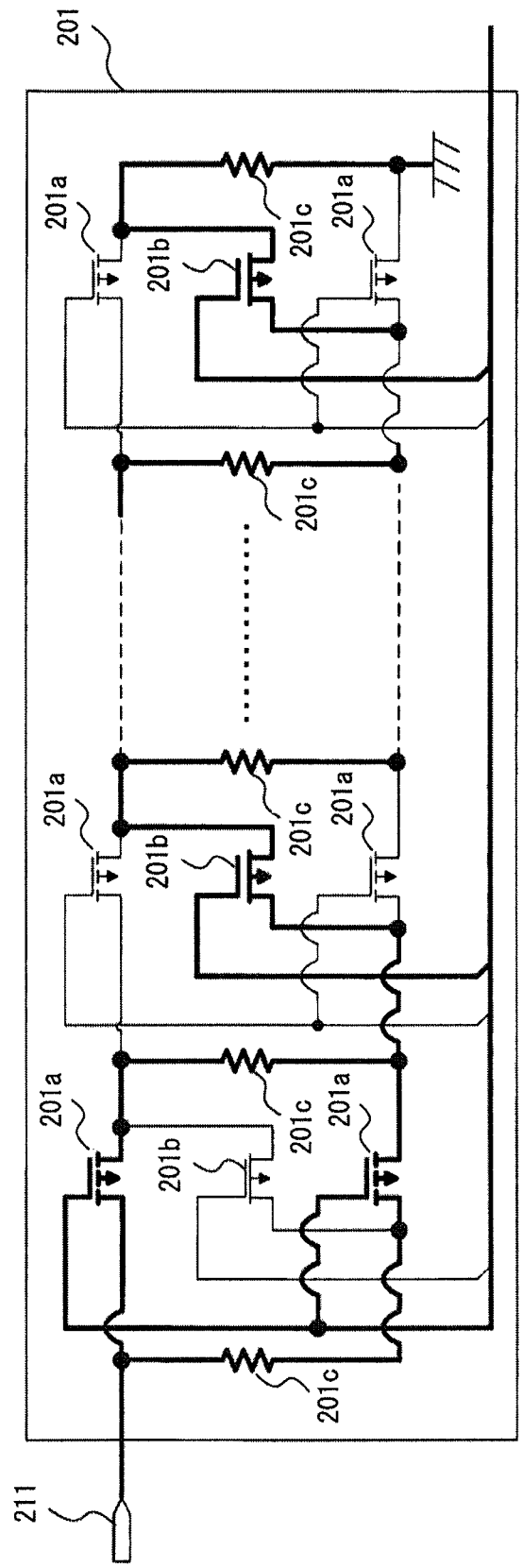
FIG. 9B is a circuit diagram illustrating an example of the internal configuration of the end point resistance unit in the second exemplary embodiment of the present invention.

As described above, by setting each of the parallel connection switches 201a, and the serial connection switches 201b to an ON-state or an OFF-state, the connection mode of the fixed resistances 201c is changed, and it is possible to change an equivalent resistance value of the termination resistance unit 201. FIG. 9A exemplifies a case, in which all the fixed resistances 201c are connected in series. FIG. 9B exemplifies a case, in which only one pair of fixed resistances 201c are connected in parallel, and all the other pairs of fixed resistances 201c are connected in series.

In the exemplary embodiment, it is assumed that when the number of pairs of parallel connection switches 201a in an ON-state is increased, the number of pairs of serial connection switches 201b in an ON-state is decreased by the same number of pairs as the increased number of pairs of parallel connection switches 201a in an ON-state. The same control is also applied when the number of pairs of switches in an OFF-state or the number of switches in an OFF-state is increased. The following is a specific example of an equivalent resistance value of the termination resistance unit 201 when ON/OFF states of the parallel connection switches 201a and the serial connection switches 201b are controlled as described above.

It is assumed that the fixed resistances 201c, the parallel connection switches 201a, the serial connection switches 201b, and the positions of switches whose states are to be changed satisfy the following four conditions.

1) Fixed Resistances 201c

The resistance values of (n+1) fixed resistances 201c are all r [a].

2) Parallel Connection Switches 201a

Among n pairs of parallel connection switches 201a, k pairs of parallel connection switches 201a (where k is a natural number equal to or smaller than n) are in an ON-state, and the other (n-k) pairs of parallel connection switches 201a are in an OFF-state.

3) Serial Connection Switches 201b

Among n serial connection switches 201b, (n-k) serial connection switches 201b are in an ON-state, and the other k serial connection switches 201b are in an OFF-state.

4) Positions of Switches Whose States are to be Changed

When the states of a plurality of pairs of parallel connection switches 201a, and a plurality of serial connection switches 201b are changed, the switches adjacent to each other, specifically, the switches whose positions are consecutive to each other are changed as a group.

In this state, the equivalent resistance value R [Ω] of the termination resistance unit 201 between the input terminal 211 and the ground level is expressed by the following equation.

$$R=\{(n-k)+1/(k+1)\}r$$

Therefore, it is possible to change the value of R from nr [Ω] to 1/(n+1)[Ω] by changing the value of k from 0 to n.

Figure 10:
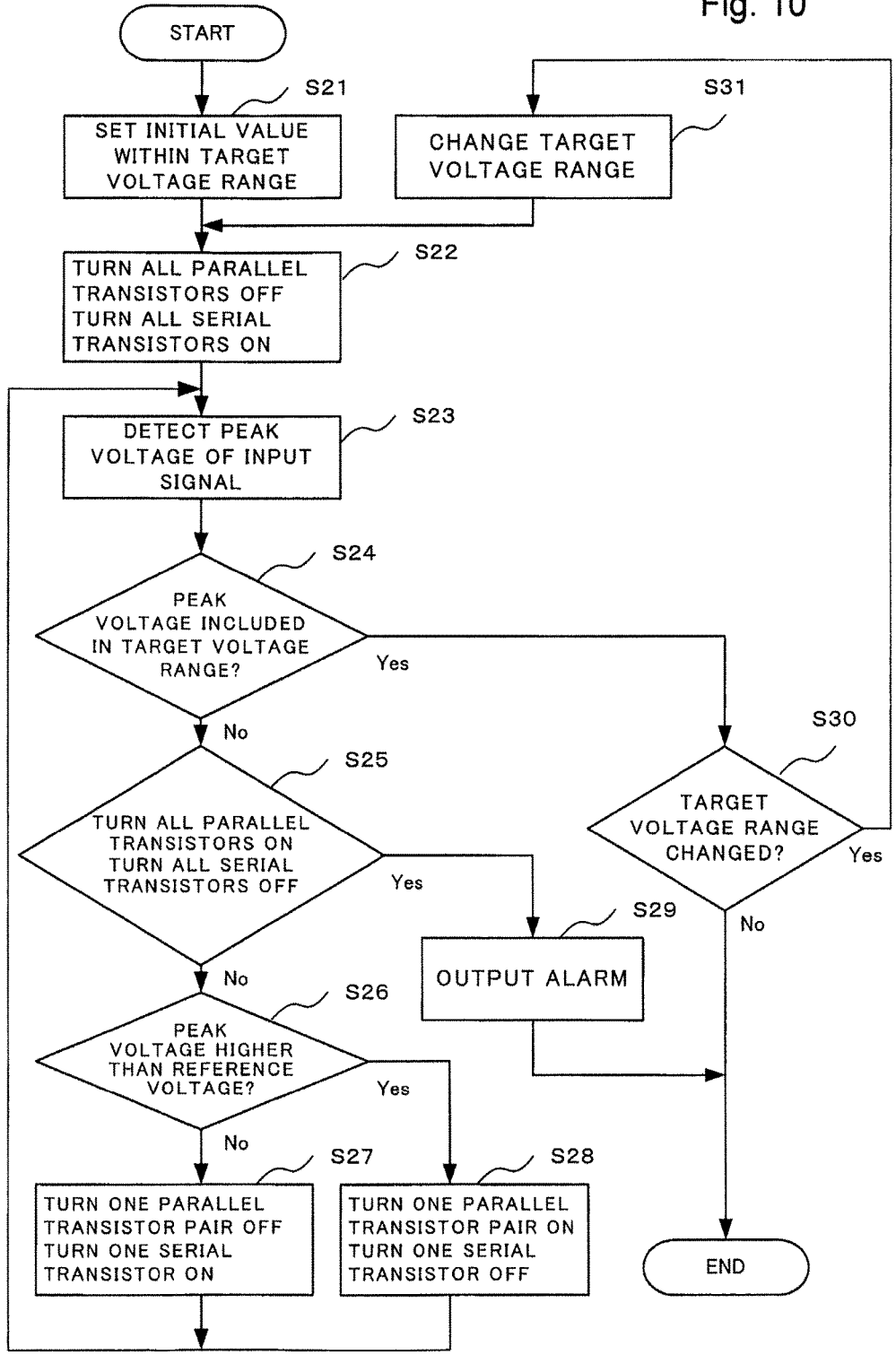
FIG. 10 is a flowchart illustrating an example of a control operation of a termination resistance value by the control unit in the second exemplary embodiment of the present invention.

FIG. 10 is a flowchart illustrating an operation of the control unit 203. Referring to FIG. 10, an operation of the control unit 203 is described.

First of all, the control unit 203 sets an initial value within a target voltage range (Step S21). The "target voltage range" is a voltage range to be satisfied by the input signal 221 to be input to the input terminal 211. Specifically, the target voltage range is set in such a manner that the absolute maximum rating and the DC standard are satisfied.

Next, the control unit 203 sets all the n pairs of parallel connection switches 201a within the variable resistance unit 201 to an OFF-state, and sets all the n serial connection switches 201b to an ON-state (Step S22). In addition to the above, the control unit 203 stores the number of pairs of parallel connection switches 201a that are set to an ON-state, and the number of serial connection switches 201b that are set to an ON-state.

Next, the control unit 203 detects a peak voltage of the input signal 221 (Step S23). Specifically, the control unit 203 receives a measurement result of a voltage of the input signal 221 (input voltage), in other words, a comparison result between an input voltage by each of the plurality of voltage comparators 202a, and a reference voltage. Then, the control unit 203 detects a peak voltage of the input signal 221 on the basis of a plurality of comparison results.

Then, the control unit 203 compares the peak voltage with the target voltage range (Step S24). When the peak voltage is included in the target voltage range (Yes in S24), the control unit 203 proceeds to the process of Step S30 to be described later.

When the peak voltage is out of the target voltage range (No in S24), the control unit 203 checks whether or not the number of pairs of parallel connection switches 202a in an ON-state, and the number of serial connection switches 202b in an OFF-state reach the number n (Step S25). The condition that the number of pairs and the number reach the number n means that all the pairs of parallel connection switches 202a are in an ON-state, and all the serial connection switches 202b are in an OFF-state, and that the resistance value R reaches a settable minimum value. When the number of pairs and the number reach the number n (Yes in S25), the control unit 203 proceeds to the process of Step S29 to be described later.

When the number of pairs and the number do not reach the number n (No in S25), the control unit 203 judges whether or not the peak voltage of the input signal 221 is higher than the target voltage range (Step S26).

When the peak voltage is lower than the target voltage range (No in S26), the control unit 203 changes only one pair of parallel connection switch 202a in an ON-state to an OFF-state, and changes only one serial connection switch 103 in an OFF-state to an ON-state (Step S27). Then, the control unit 203 returns to the process of Step S23.

When the peak voltage is higher than the target voltage range (Yes in S26), the control unit 203 changes only one pair of parallel connection switch 202a in an OFF-state to an ON-state, and changes only one serial connection switch 202b in an ON-state to an OFF-state (Step S28). Then, the control unit 203 returns to the process of Step S23.

The condition that the number of pairs and the number reach the number n in the process of Step S25 (Yes in S25) means that it is impossible to set a peak voltage of the input signal 221 in the target voltage range with use of the settable range of the resistance value R, in other words, automatic adjustment of the termination resistance value has been failed. In this case, the control unit 203 causes the alarm terminal 213 to output an alarm signal (Step S29).

In the process of Step S24, when the peak voltage of the input signal 221 is included in the target voltage range (Yes in S24), the control unit 203 checks whether or not it is necessary to change the target voltage range (Step S30). Whether or not it is necessary to change the target voltage range is instructed by the user. Alternatively, the control unit 203 may judge whether or not it is possible to set a range narrower than the current target voltage range, and may judge it is necessary to change the target voltage range when it is possible to set a range narrower than the current target voltage range.

When the target voltage range is changed, the control unit 203 changes the current target voltage range to a new target voltage range (Step S31).

When the target voltage range is not changed, the control unit 203 terminates the process.

As described above, the semiconductor device in the exemplary embodiment changes the target voltage range even when an input voltage satisfies the target voltage range, and, in addition to the above, repeats adjustment of the termination resistance value. Therefore, it is possible to change, as necessary, the margin of the target voltage range with respect to the absolute maximum rating and the DC standard according to an actual waveform of an input signal. This makes it possible to realize a more appropriate termination state. Thus, the semiconductor device in the exemplary embodiment is capable of automatically setting an internal termination resistance value to a more appropriate value. Therefore, the semiconductor device in the exemplary embodiment not only simply satisfies a rating or a standard, but also can receive an input signal of a more appropriate waveform in a termination state that satisfies the rating and the standard with a margin.

Further, the semiconductor device automatically adjusts the termination resistance value. Therefore, an evaluation workload by a hardware developer for adjusting the termination resistance value is not necessary. Accordingly, this makes it possible to significantly reduce the workload by a developer.

Third Exemplary Embodiment

Generally, it is often the case that an electronic device such as a semiconductor device is provided with a plurality of input terminals. In this case, an output device connected to an external device for outputting a signal may differ among input terminals, or the output drive performance may differ among output devices. Therefore, it is not always the case that an appropriate termination resistance value is the same as each other among the input terminals. In view of the above, when there are a plurality of input terminals, it is desirable to control the termination resistance value for each of the input terminals. In order to perform the control, it is necessary to provide a termination unit for each of the input terminals, and to judge whether or not the termination resistance value is appropriate for each of the input terminals. Note that it is not necessary to provide a voltage measuring unit and a control unit for each of the input terminals.

Figure 11:
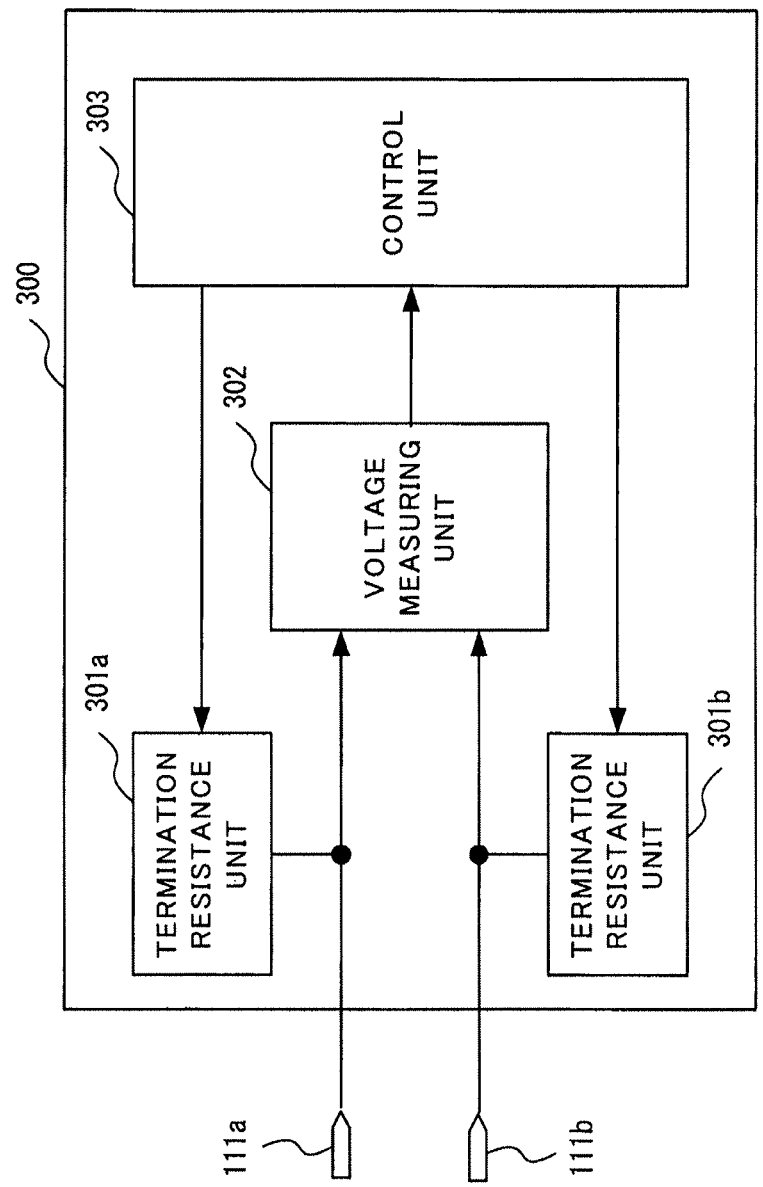
FIG. 11 is a block diagram illustrating a configuration example of a termination device in a third exemplary embodiment of the present invention.

FIG. 11 is a block diagram illustrating a configuration example of a termination device 300 in the third exemplary embodiment of the present invention.

The termination device 300 changes a termination resistance value for each of the input terminals. The termination device 300 is provided with termination resistance units 301a and 301b for the respective input terminals, a common voltage measuring unit 302, and a common control unit 303.

In the exemplary embodiment, the termination device 300 is provided with input terminals 111a and 111b.

An operation of the termination device 300 with respect to each of the input terminals 111a and 111b is the same as the operation of the termination device 100 in the first exemplary embodiment. Specifically, the termination device 300 obtains an appropriate termination resistance value for each of the input terminals 111a and 111b.

Appropriate termination resistance values for the input terminals are successively determined. Specifically, first of all, the termination resistance unit 301a, the voltage measuring unit 302, and the control unit 303 are used to obtain a termination resistance value appropriate for the input terminal 111a. Then, following the aforementioned operation, the termination resistance unit 301b, the voltage measuring unit 302, and the control unit 303 are used to obtain a termination resistance value appropriate for the input terminal 111b.

In this way, at the time of determining a termination resistance value appropriate for each of the input terminals 111a and 111b, the voltage measuring unit 302 and the control unit 302 are commonly used.

After an appropriate termination resistance value is determined for each of the input terminals, the control unit 303 applies the termination resistance values appropriate for the input terminals 111a and 111b to the termination resistance units 301a and 301 b, respectively.

As described above, the termination device 300 in the exemplary embodiment is provided with a plurality of input terminals, and termination resistance values appropriate for the input terminals are applied to the termination resistance units 301a and 301b, respectively. The termination device 300 commonly uses the voltage measuring unit 302 and the control unit 302 in determining termination resistance values appropriate for the input terminals. Accordingly, this makes it possible to minimize the number of hardware components to be provided in the termination device 300 for determining appropriate termination resistance values.

Note that also when the number of input terminals is three or more, it is possible to obtain a termination resistance value appropriate for each of the input terminals, by commonly using the voltage measuring unit 302 and the control unit 302 in the same manner as the aforementioned configuration.

Further, as illustrated in FIG. 2, the termination configuration may be any one of a pullup configuration, a pulldown configuration, and a Thevenin configuration. Further, as described in the first exemplary embodiment, the termination device 300 may output an alarm for notifying that adjustment of a termination resistance value within a target standard has been failed.

Fourth Exemplary Embodiment

The number of external devices to be connected to an input terminal is not limited to one. For instance, in the case of a memory LSI, it is often the case that a plurality of devices are connected to a bus. In this case, it is not always the case that termination resistance values appropriate for signals to be input from the devices are the same as each other. In view of the above, when a plurality of devices are connected to an input terminal, it is desirable to control a termination resistance value for each of the devices.

Figure 12:
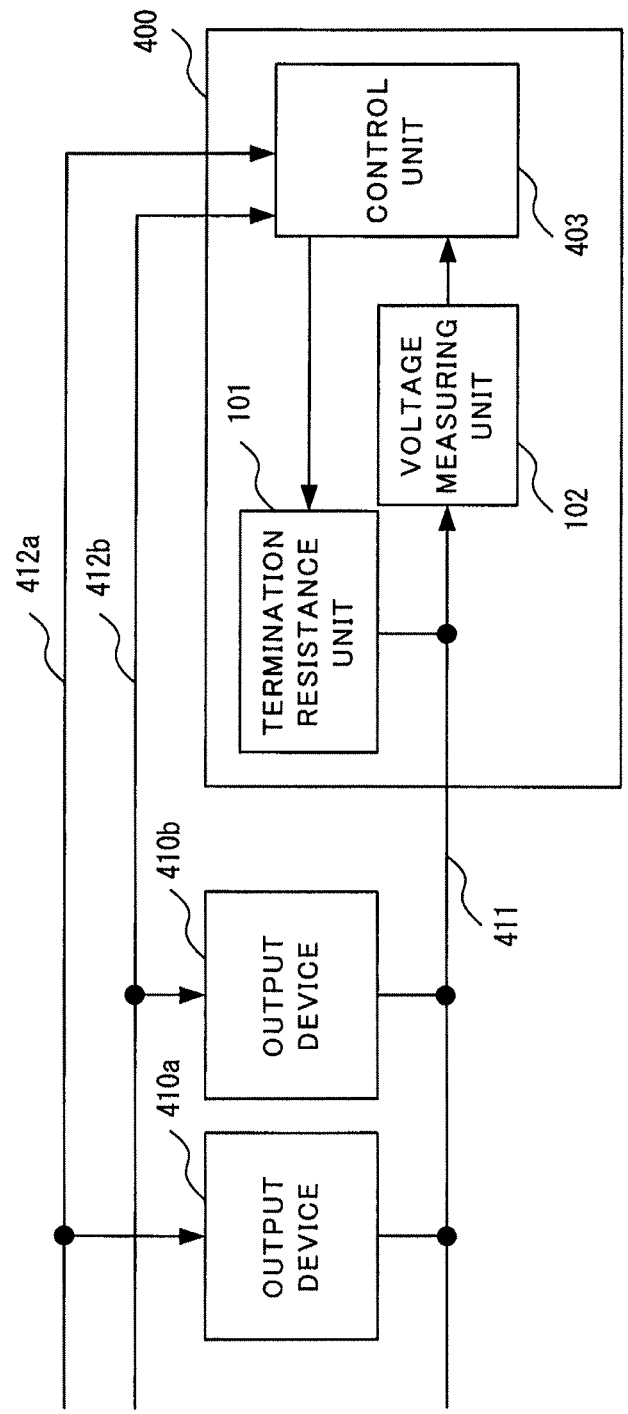
FIG. 12 is a block diagram illustrating a configuration example of a termination device in a fourth exemplary embodiment of the present invention.

FIG. 12 is a block diagram illustrating a configuration example of a termination device 400 in the fourth exemplary embodiment of the present invention.

The termination device 400 changes a termination resistance value for each of external devices connected to the termination device 400. The termination device 400 is provided with a termination resistance unit 101, a voltage measuring unit 102, and a control unit 403. In the exemplary embodiment, it is assumed that output devices 410a and 410b are connected to an input signal line 411 of the termination device 400.

When the output devices 410a and 410b are selected as devices for inputting a signal to the input signal line 411, selection signals 412a and 412b are respectively input to the output devices 410a and 410b. The selection signals 412a and 412b are also input to the control unit 403. It is needless to say that when the output devices 410a and 410b are selected as devices for inputting a signal to the input signal line 411, only one of the output devices 410a and 410b is selected.

An operation of the termination device 400 to be performed when the output device 410a or the output device 410b is selected is the same as the operation of the termination device 200 in the first exemplary embodiment. Specifically, the termination device 400 obtains termination resistance values appropriate for the output devices 410a and 410b. Then, the control unit 403 stores the termination resistance values appropriate for the output devices 410a and 410b. Then, when the selection signal 412a is input, the control unit 403 applies the termination resistance value appropriate for the output device 410a to the termination resistance unit 101, and when the selection signal 412b is input, the control unit 403 applies the termination resistance value appropriate for the output device 410b to the termination resistance unit 101.

As described above, when a plurality of output devices are connected on the outside of a certain input terminal, the termination device 400 in the exemplary embodiment applies a termination resistance value more appropriate for an output device, which is selected as the output device with respect to the input terminal. Accordingly, this makes it possible to perform an appropriate termination process no matter which output device is selected.

Note that also when the number of external devices is three or more, it is possible to obtain and store a termination resistance value appropriate for each of the devices, and to apply a termination resistance value appropriate for a selected one of the devices to the termination resistance unit 101 in the same manner as the aforementioned configuration.

A subject for executing each of the processes of termination control by the control unit illustrated in the flowcharts of FIG. 4 and FIG. 10 is not limited. The termination control may be executed by a hardware component. Alternatively, a termination device may be provided with a Central Processing Unit (CPU, not illustrated), and the CPU may read a termination control program from a predetermined storage means (not illustrated) for execution to perform the termination control.

Note that the aforementioned program may be stored in a semiconductor storage device such as a Read Only Memory (ROM), a Random Access Memory (RAM), or a flash memory; or in a non-transitory medium such as an optical disc, a magnetic disk, or a magneto-optical disk.

Note that each of the aforementioned exemplary embodiments may be combined with the other one or more of the exemplary embodiments.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2014-057797, filed on Mar. 20, 2014, the disclosure of which is incorporated herein in its entirety by reference.

REFERENCE SIGNS LIST

100 Termination device
101 Termination resistance unit
101a Variable resistor
111, 111a, 111b Input terminal
120 Electronic device
121 Input signal
200 Termination unit
201 Termination resistance unit
201a Parallel connection switch
201b Serial connection switch
201c Fixed resistance
202 Voltage measuring unit
202a Comparator
202b Divided resistance
202c Diode
202d Capacitor
202e Discharging switch
202f Peak-hold circuit
203a RS latch
211 Input terminal
212 Internal terminal
213 Alarm terminal
220 Semiconductor device
221 Input signal
222 Resistance value control signal
223 Reset signal
300 Termination device
400 Termination device
411 Input signal line
412a, 412b Selection signal

The invention claimed is:

1. A termination device comprising:
an input terminal which receives an input signal;
a terminator which terminates the input terminal by a variable resistance whose resistance value is settable;
a voltage measure which measures a voltage of the input signal; and
a control which changes the resistance value when the voltage is not included in a target voltage range set for the input signal on a basis of an absolute maximum rating value and an operation guarantee voltage,
wherein, the control sets a new target voltage range when the voltage once satisfies the target voltage range, and then changes the resistance value again.

2. The termination device according to claim 1, wherein the control holds a peak voltage being a peak value of the voltage, and changes the resistance value or the target voltage range when the peak voltage is not included in the target voltage range.

3. The termination device according to claim 1, wherein the variable resistance includes a plurality of resistive elements, and sets the resistance value by switching a mutual connection relationship between the plurality of resistive elements.

4. The termination device according to claim 3, wherein the variable resistance changes the resistance value by connecting each of the plurality of the resistive elements in series between the input terminal and the fixed potential terminal, or by connecting each of the plurality of the resistive elements in parallel to the other one of the resistive elements.

5. The termination device according to claim 1, wherein the terminator terminates the input terminal by a designated circuit configuration out of a pullup configuration, a pulldown configuration, and a Thevenin configuration, and
the control changes the circuit configuration when the voltage is not included in the target voltage range.

6. The termination device according to claim 1, comprising:
a plurality of the input terminals, wherein
the voltage measure measures the voltage of the input signal input to a selected one of the plurality of the input terminals, and
the control changes the resistance value or the target voltage range when the voltage is not included in the target voltage range.

7. The termination device according to claim 1, wherein the input signal is input by one of a plurality of external output devices, and
the control changes the resistance value depending on the output device which receives the input signal.

8. An electronic device comprising:
the termination device of claim 1; and
an internal circuit which receives the input signal as an internal signal, and performs a predetermined process.

9. A termination control method comprising:
measuring a voltage of an input signal input to an input terminal; and
changing a resistance value which terminates the input when the voltage is not included in a target voltage range set for the input signal on a basis of an absolute maximum rating value and an operation guarantee voltage,
setting a new target voltage range when the voltage once satisfies the target voltage range, and then changing the resistance value again.

10. A storage medium storing a termination control program which causes a computer provided in a termination device including an input terminal which receives an input signal, a terminator which terminates the input terminal by a variable resistance whose resistance value is settable, and a voltage measure which measures a voltage of the input signal to function as:
  a control which changes the resistance value when the voltage is not included in a target voltage range set for the input signal on a basis of an absolute maximum rating value and an operation guarantee voltage,
  wherein, the control sets a new target voltage range when the voltage once satisfies the target voltage range, and then changes the resistance value again.

* * * * *